US007169518B1

(12) United States Patent
Savariar-Hauck et al.

(10) Patent No.: US 7,169,518 B1
(45) Date of Patent: Jan. 30, 2007

(54) MULTILAYER IMAGEABLE ELEMENT WITH IMPROVED CHEMICAL RESISTANCE

(75) Inventors: Celin Savariar-Hauck, Badenhausen (DE); Harald Baumann, Osterode/Harz (DE); Anthony P. Kitson, Evans, CO (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/405,185

(22) Filed: Apr. 17, 2006

(51) Int. Cl.
*G03F 7/038* (2006.01)
*G03F 7/11* (2006.01)
*G03F 7/14* (2006.01)

(52) U.S. Cl. ..................... 430/15; 430/271.1; 430/302; 430/330; 430/905; 430/910; 430/964

(58) Field of Classification Search ............. 430/271.1, 430/302, 330, 905, 910, 964, 15
See application file for complete search history.

(56) References Cited

U.S. PATENT DOCUMENTS

| | | | |
|---|---|---|---|
| 6,152,036 A | 11/2000 | Verschueren et al. |
| 6,294,311 B1 | 9/2001 | Shimazu et al. |
| 6,352,811 B1 | 3/2002 | Patel et al. |
| 2004/0137366 A1 | 7/2004 | Kawauchi et al. |

*Primary Examiner*—Richard L. Schilling
(74) *Attorney, Agent, or Firm*—J. Lenny Tucker

(57) ABSTRACT

A positive-working imageable element comprises inner and outer layers and an infrared radiation absorbing compound such as an IR absorbing dye. The inner layer includes a first polymeric material. The ink receptive outer layer includes a second polymeric binder comprising pendant carboxy groups that provides improved chemical resistance to the imageable element and reduced residue from development.

20 Claims, No Drawings

MULTILAYER IMAGEABLE ELEMENT WITH IMPROVED CHEMICAL RESISTANCE

FIELD OF THE INVENTION

This invention relates to positive-working imageable elements having improved resistance to processing and printing chemicals. It also relates to a method of forming imaged elements from such imageable elements using thermal imaging means.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. For example, the ink can be first transferred to an intermediate blanket that in turn is used to transfer the ink to the surface of the material upon which the image is to be reproduced.

Imageable elements useful to prepare lithographic printing plates typically comprise an imageable layer applied over the hydrophilic surface of a substrate. The imageable layer includes one or more radiation-sensitive components that can be dispersed in a suitable binder. Alternatively, the radiation-sensitive component can also be the binder material. Following imaging, either the imaged regions or the non-imaged regions of the imageable layer are removed by a suitable developer, revealing the underlying hydrophilic surface of the substrate. If the imaged regions are removed, the element is considered as positive-working. Conversely, if the non-imaged regions are removed, the element is considered as negative-working. In each instance, the regions of the imageable layer (that is, the image areas) that remain are ink-receptive, and the regions of the hydrophilic surface revealed by the developing process accept water and aqueous solutions, typically a fountain solution, and repel ink.

Imaging of the imageable element with ultraviolet and/or visible radiation is typically carried out through a mask that has clear and opaque regions. Imaging takes place in the regions under the clear regions of the mask but does not occur in the regions under the opaque mask regions. If corrections are needed in the final image, a new mask must be made. This is a time-consuming process. In addition, dimensions of the mask may change slightly due to changes in temperature and humidity. Thus, the same mask, when used at different times or in different environments, may give different results and could cause registration problems.

Direct digital imaging has obviated the need for imaging through a mask and is becoming increasingly important in the printing industry. Imageable elements for the preparation of lithographic printing plates have been developed for use with infrared lasers. Thermally imageable, multi-layer elements are described, for example, U.S. Pat. No. 6,294,311 (Shimazu et al.), U.S. Pat. No. 6,352,812 (Shimazu et al.), U.S. Pat. No. 6,593,055 (Shimazu et al.), U.S. Pat. No. 6,352,811 (Patel et al.), U.S. Pat. No. 6,358,669 (Savariar-Hauck et al.), and U.S. Pat. No. 6,528,228 (Savariar-Hauck et al.), U.S. Patent Application Publication 2004/0067432 A1 (Kitson et al.). U.S. Patent Application Publication 2005/0037280 (Loccufier et al.) describes heat-sensitive printing plate precursors that comprise a phenolic developer-soluble polymer and an infrared radiation absorbing agent in the same layer.

Imageable elements having topcoats comprising cyclic olefin copolymers are described in U.S. Pat. No. 6,969,570 (Kitson). Further, U.S. Patent Application Publication 2004/0137366 (Kawauchi et al.) describes the use of copolymers comprising pendant carboxy groups or maleic anhydride in top layers of heat-sensitive positive-working elements to improve scratch resistance and development latitude. These copolymers can be developed in relatively "weak" developers that may be considered more environmentally "friendly".

U.S. Pat. No. 6,152,036 (Verschueren et al.) describes the use of hardened or crosslinked epoxy resins in the top layers of positive-working imaging elements.

Problem to be Solved

In use, a lithographic printing plate comes into contact with fountain solutions and inks. In addition, the element is often subjected to blanket washes to remove inks and various cleaning solutions for blanket and press rollers. Despite the progress in various positive-working imageable elements, there is a continuing need for imageable elements that are resistant to press chemistries, such as inks, fountain solution, and the solvents used in washes, such as UV washes. Moreover, it is desired to be able to develop such imageable elements using aqueous negative alkaline developers with insignificant residue or sludge.

SUMMARY OF THE INVENTION

This invention provides a positive-working imageable element that is developable with an alkaline developer after thermal imaging, and that comprises a radiation absorbing compound and a substrate having thereon, in order:

an inner layer comprising a first polymeric binder, and an ink receptive outer layer comprising a second polymeric binder different than the first polymeric binder, the second polymeric binder comprising recurring units represented by the following Structure (I) or (II), which recurring units comprise at least 3 mol % of the total recurring units in the second polymeric binder:

(I)

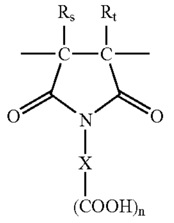

(II)

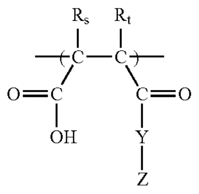

wherein n is 1 to 3, $R_s$ and $R_t$ are independently hydrogen or an alkyl or halo group, X is a multivalent linking group, Y is oxy or —NR— wherein R is hydrogen or an alkyl group, and Z is a monovalent organic group.

This invention also provides a method for forming an image comprising:

A) thermally imaging the positive-working imageable element of the present invention (as described above), thereby forming an imaged element with imaged and non-imaged regions, and B) contacting the imaged element with an alkaline developer to remove only the imaged regions, and C) optionally, baking the imaged and developed element.

This invention additionally comprises images and imaged elements formed using the method of this invention.

The imageable elements of the present invention contain certain polymeric binders in the outer layer (topcoat) that provide improved chemical resistance, and the imaged elements can be processed especially in negative developers with minimal residue or sludge. These advantages are achieved by incorporating the polymeric binder comprising recurring units represented by Structure (I) or (II) defined herein.

DETAILED DESCRIPTION OF THE INVENTION

Definitions

Unless the context indicates otherwise, when used herein, the terms "imageable element", "positive-working imageable element", and "printing plate precursor" are meant to be references to embodiments of the present invention.

In addition, unless the context indicates otherwise, the various components described herein such as "first polymeric binder", "second polymeric binder", "dissolution inhibitor", "added copolymer", "coating solvent", "infrared radiation absorbing compound", "developer", and similar terms also refer to mixtures of such components. Thus, the use of the article "a" or "an" is not necessarily meant to refer to only a single component.

Unless otherwise indicated, percentages refer to percents by dry weight.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287–2311 (1996). However, any definitions explicitly set forth herein should be regarded as controlling.

Unless otherwise indicated, the term "polymer" refers to high and low molecular weight polymers including oligomers and includes homopolymers and copolymers.

The term "copolymer" refers to polymers that are derived from two or more different monomers. That is, they comprise recurring units having at least two different chemical structures.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Uses

The positive-working imageable elements can be used in a number of ways. The preferred use is as precursors to lithographic printing plates as described in more detail below. However, this is not meant to be the only use of the present invention. For example, the imageable elements can also be used as thermal patterning systems and to form masking elements and printed circuit boards.

Imageable Elements

In general, the imageable element comprises a substrate, an inner layer (also known as an "underlayer"), and an outer layer (also known as a "top layer" or "topcoat") disposed over the inner layer. Before thermal imaging, the outer layer is generally not removable by an alkaline developer within the usual time allotted for development, but after thermal imaging, the imaged regions of the outer layer are more readily removable by or dissolvable in the alkaline developer. The inner layer is also generally removable by the alkaline developer. An infrared radiation absorbing compound (defined below) is also present in the imageable element, and is preferably present in the inner layer but may optionally be in a separate layer between the inner and outer layers.

The imageable elements are formed by suitable application of an inner layer composition onto a suitable substrate. This substrate can be an untreated or uncoated support but it is usually treated or coated in various ways as described below prior to application of the inner layer composition. The substrate generally has a hydrophilic surface or at least a surface that is more hydrophilic than the outer layer composition. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

A preferred substrate is composed of an aluminum support that may be treated using techniques known in the art, including physical graining, electrochemical graining, chemical graining, and anodizing. Preferably, the aluminum sheet has been subjected to electrochemical graining and is anodized.

An interlayer may be formed by treatment of the aluminum support with, for example, a silicate, dextrine, calcium zirconium fluoride, hexafluorosilicic acid, sodium phosphate/sodium fluoride, poly(vinyl phosphonic acid) (PVPA), vinyl phosphonic acid copolymer, poly(acrylic acid), or acrylic acid copolymer. Preferably, an electrochemically grained and anodized aluminum support is treated with PVPA using known procedures to improve surface hydrophilicity.

The thickness of the substrate can be varied but should be sufficient to sustain the wear from printing and thin enough to wrap around a printing form. Preferred embodiments include a treated aluminum foil having a thickness of from about 100 to about 600 μm.

The backside (non-imaging side) of the substrate may be coated with antistatic agents and/or slipping layers or a matte layer to improve handling and "feel" of the imageable element.

The substrate can also be a cylindrical surface having the various layer compositions applied thereon, and thus be an integral part of the printing press. The use of such imaged cylinders is described for example in U.S. Pat. No. 5,713,287 (Gelbart).

The inner layer is disposed between the outer layer and the substrate. Typically, it is disposed directly on the substrate. The inner layer comprises a polymeric material that is removable by the developer and preferably soluble in the developer to reduce sludging of the developer. In addition, the polymeric material is preferably insoluble in the solvent used to coat the outer layer so that the outer layer can be coated over the inner layer without dissolving the inner layer. This polymeric material is identified herein as the "first polymeric binder" so as to distinguish it from the "second polymeric binder" described below for the outer layer. Mixtures of these first polymeric binders can be used if desired in the inner layer.

Useful first polymeric binders for the inner layer include (meth)acrylonitrile polymers, (meth)acrylic resins comprising carboxy groups, polyvinyl acetals, maleated wood rosins, styrene-maleic anhydride copolymers, (meth)acrylamide polymers such as polymers derived from N-alkoxyalkyl methacrylamide, polymers derived from an N-substituted cyclic imide, polymers having pendant cyclic urea groups, and combinations thereof. First polymeric binders that provide resistance both to fountain solution and aggressive washes are disclosed in U.S. Pat. No. 6,294,311 (noted above) that is incorporated herein by reference.

Particularly useful first polymeric binders include (meth) acrylonitrile polymers, and polymers derived from an N-substituted cyclic imide (especially N-phenylmaleimide), a (meth)acrylamide (especially methacrylamide), a monomer having a pendant cyclic urea group, and a (meth)acrylic acid (especially methacrylic acid). Preferred first polymeric binders of this type are copolymers that comprise from about 20 to about 75 mol % and preferably about 35 to about 60 mol % or recurring units derived from N-phenylmaleimide, N-cyclohexylmaleimide, N-(4-carboxyphenyl)maleimide, N-benzylmaleimide, or a mixture thereof, from about 10 to about 50 mol % and preferably from about 15 to about 40 mol % of recurring units derived from acrylamide, methacrylamide, or a mixture thereof, and from about 5 to about 30 mol % and preferably about 10 to about 30 mol % of recurring units derived from methacrylic acid. Other hydrophilic monomers, such as hydroxyethyl methacrylate, may be used in place of some or all of the methacrylamide. Other alkaline soluble monomers, such as acrylic acid, may be used in place of some or all of the methacrylic acid. Optionally, these polymers can also include recurring units derived from (meth)acrylonitrile or N-[2-(2-oxo-1-imidazolidinyl)ethyl]-methacrylamide.

The bakeable inner layers described in WO 2005/018934 (Kitson et al.) and U.S. Pat. No. 6,893,783 (Kitson et al.), the disclosures of which are all incorporated herein by reference, may also be used.

Other useful first polymeric binders can comprise, in polymerized form, from about 5 mol % to about 30 mol % (preferably from about 10 mol % to about 30 mol % of recurring units) derived from an ethylenically unsaturated polymerizable monomer having a carboxy group (such as acrylic acid, methacrylic acid, itaconic acid, and other similar monomers known in the art (acrylic acid and methacrylic acid are preferred), from about 20 mol % to about 75 mol % (preferably from about 35 mol % to about 60 mol %) of recurring units derived from N-phenylmaleimide, N-cyclohexylmaleimide, or a mixture thereof, optionally, from about 5 mol % to about 50 mol % (preferably when present from about 15 mol % to about 40 mol %) of recurring units derived from methacrylamide, and from about 3 mol % to about 50 mol % (preferably from about 10 mol % to about 40 mol % of one or more recurring units derived from monomer compounds of the following Structure (IV):

$$CH_2{=}C(R_2){-}C({=}O){-}NH{-}CH_2{-}OR_1 \qquad (IV)$$

wherein $R_1$ is a $C_1$ to $C_{12}$ alkyl, phenyl, $C_1$ to $C_{12}$ substituted phenyl, $C_1$ to $C_{12}$ aralkyl, or $Si(CH_3)_3$, and $R_2$ is hydrogen or methyl. Methods of preparation of certain of these polymeric materials are disclosed in U.S. Pat. No. 6,475,692 (Jarek), the disclosure of which is incorporated herein by reference.

The first polymeric binder useful in this invention can also be hydroxy-containing polymeric material composed of recurring units derived from two or more ethylenically unsaturated monomers wherein from about 1 to about 50 mol % (preferably from about 10 to about 40 mol %) of the recurring units are derived from on or more of the monomers represented by the following Structure (V):

$$CH_2{=}C(R_3)C({=}O)NR_4(CR_5R_6)_mOH \qquad (V)$$

wherein $R_3$, $R_4$, $R_5$, $R_6$ are independently hydrogen, substituted or unsubstituted lower alkyl having 1 to 10 carbon atoms (such as methyl, chloromethyl, ethyl, iso-propyl, t-butyl, and n-decyl), or substituted or unsubstituted phenyl, and m is 1 to 20.

Preferred embodiments of hydroxy-containing first polymeric binders can be represented by the following Structure (VI):

$$-(A)_x-(B)_y-(C)_z- \qquad (VI)$$

wherein A represents recurring units represented by the following Structure (VII):

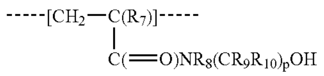

(VII)

wherein $R_7$ through $R_{10}$ and p are as defined the same as $R_3$ through $R_6$ and m noted above for Structure (V).

In Structure (VI), B represents recurring units comprising acidic functionality or an N-maleimide group, and C represents recurring units different from A and B, x is from about 1 to about 50 mol % (preferably from about 10 to about 40 mol %), y is from about 40 to about 90 mol % (from about 40 to about 70 mol %), and z is 0 to about 70 mol % (preferably from 0 to about 50 mol %), based on total recurring units.

In some embodiments of Structure (VI):

A represents recurring units derived from one or both of N-hydroxymethylacrylamide and N-hydroxymethylmethacrylamide, B represents recurring units derived from one or more of N-phenylmaleimide, N-cyclohexylnaleimide, N-benzylmaleimide, N-(4-carboxyphenyl)maleimide, (meth)acrylic acid, and vinyl benzoic acid, C represents recurring units derived from one or more of a styrenic monomer (such as styrene and derivatives thereof), meth(acrylate) ester, N-substituted (meth)acrylamide, maleic anhydride, (meth)acrylonitrile, allyl acrylate, and a compound represented by the following Structure (VII):

(VII)

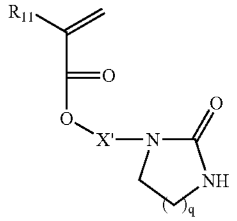

wherein $R_{11}$ is hydrogen, methyl, or halo, X' is alkylene having 2 to 12 carbon atoms, q is 1 to 3, x is from about 10 to 40 mol %, y is from about 40 to about 70 mol %, and z is from 0 to about 50 mol %, all based on total recurring units.

In more preferred embodiments for Structure VI, B represents recurring units derived from at least one of N-phenylmaleimide, N-cyclohexylmaleimide, N-benzylmaleimide, N-(4-carboxyphenyl)maleimide in an amount of from about 20 to about 50 mol %, and recurring units derived from at least one of (meth)acrylic acid and vinyl benzoic acid in an amount of from about 10 to about 30 mol %, based on total recurring units.

In such embodiments, C represents recurring units derived from methacrylamide, (meth)acrylonitrile, maleic anhydride, or

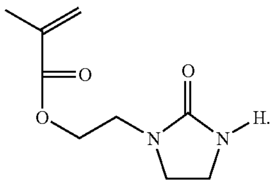

Still other useful first polymeric binders are addition or condensation polymers that have a polymer backbone to which are attached pendant phosphoric acid groups, pendant adamantyl groups, or both types of pendant groups. The pendant adamantyl groups are connected to the polymer backbone at least through a urea or urethane linking group but other linking groups can also be present.

Preferred first polymeric binders of this type can be represented by the following Structure (VIII):

$$-(A)_x-(B)_y- \quad \text{(VIII)}$$

wherein A and B together represents the polymer backbone in which A further comprises recurring units comprising pendant phosphoric acid groups, pendant adamantyl groups, or both, B further represents different recurring units, x represents 5 to 100 weight %, and y represents 0 to 95 weight %, provided that if A comprises pendant adamantyl groups, such groups are connected to the polymer backbone through a urea or urethane linking group (but other linking groups can also be present).

More preferably, such first polymeric binders can be represented by the following Structure (IX):

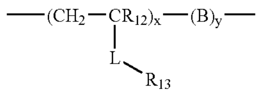

(IX)

wherein $R_{12}$ represents hydrogen, a substituted or unsubstituted lower alkyl group having 1 to 4 carbon atoms (such as methyl, ethyl, n-propyl, or t-butyl), or a halo group.

L represents a direct bond or a linking group comprising 1 or more carbon atoms and optionally 1 or more heteroatoms in the linking chain. Useful linking groups can include, but are not limited to, substituted or unsubstituted, linear or branched alkylene groups having 1 to 10 carbon atoms (such as methylene, methoxymethylene, ethylene, iso-propylene, n-butylene, t-butylene, and n-hexylene), substituted or unsubstituted cycloalkylene groups having 5 to 10 carbon atoms in the cyclic group (such as 1,3-cyclopentylene and 1,4-cyclohexylene), substituted or unsubstituted arylene groups having 6 to 10 carbon atoms in the cyclic group (such as 1,4-phenylene, 3-methyl-1,4-phenylene, or naphthylene), or combinations thereof, such as arylenealkylene, alkylenearylene, and alkylenearylenealkylene groups. The L linking groups can also include one or more oxy, thio, amido, carbonyl, oxycarbonyl, carbonyloxy, carbonamido, sulfonamido, urea, urethane, and carbonate [—O—C(=O)—O—] groups within the linking chain, with or without any of the alkylene, cycloalkylene, and arylene groups described above. L can include combinations of two or more of these groups.

Preferably, L is a direct bond or one or more of alkylene groups having 1 to 4 carbon atoms in the linking chain, carbonyloxy, urea, urethane, alkyleneoxy, alkylenecarbonyloxy, and carboxyalkylene groups. More preferably, L comprises at least one —C(=O)O— (carbonyloxy), —NH—C(=O)—NH— (urea), —C(=O)—O—$(CH_2)_2$—, or —NH—C(=O)—O— (urethane) group.

In Structure (IX), $R_{13}$ represents a pendant phosphoric acid group, a pendant adamantyl group, or both types of pendant groups. The solvent-resistant polymer can comprise one or more different recurring units having phosphoric acid groups or one or more different recurring units having adamantyl groups. Alternatively, the polymer can include a mixture of one or more different recurring units having phosphoric acid groups and one or more different recurring units having adamantyl groups. When R' is a pendant adamantyl group, L comprises a urea or urethane linking group within the linking chain.

In referring to "phosphoric acid" groups, it is also intended to include the corresponding salts of the phosphoric acid, including but not limited to, alkali metal salts and ammonium salts. Any suitable positive counterion can be used with the pendant phosphoric acid groups as long as the counterion does not adversely affect the performance of the resulting polymer or other desired imaging properties.

In more preferred embodiments of Structures VIII and IX, x is from about 5 to about 20 weight % and y is from about 80 to about 95 weight % when A represents recurring units comprising pendant phosphoric acid groups. Alternatively, x is from about 5 to about 40 weight % and B is from about 60 to about 95 weight % when A represents recurring units comprising pendant adamantyl groups.

Particularly useful ethylenically unsaturated polymerizable monomers that can used to provide the A recurring units described above for Structures VIII and IX include, but are not limited to the following compounds represented by the following Structures A1 through A5:

(A1)

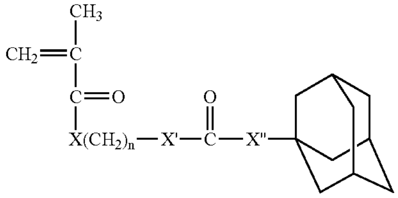

wherein X is oxy, thio, or —NH— (preferably oxy), X' is —NH— or oxy, X" is oxy or —NH—, and n is 1 to 6 (preferably 2 to 4).

(A2)

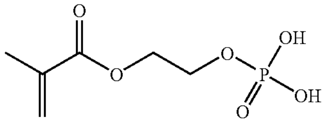

Ethylene lycol methacrylate phosphate (A3)

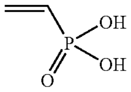

Vinyl phosphonic acid (A4)

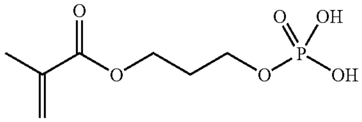

1,3-Propylene glycol methacrylate phosphate (A5)

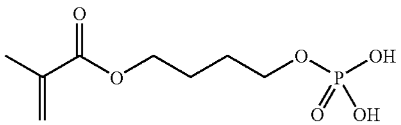

1,4-n-Butylene glycol methacrylate phosphate

In Structures (VIII) and (IX), B represents recurring units derived from a one or more ethylenically unsaturated polymerizable monomers that do not have pendant phosphoric acid groups or adamantyl groups. A variety of monomers can be used for providing B recurring units, including styrenic monomers, (meth)acrylamide, (meth)acrylic acids or esters thereof, (meth)acrylonitrile, vinyl acetate, maleic anhydride, N-substituted maleimide, or mixtures thereof.

Preferably, the recurring units represented by B are derived from styrene, N-phenylmaleimide, methacrylic acid, (meth)acrylonitrile, or methyl methacrylate, or mixtures of two or more of these monomers.

In some embodiments, the first polymeric binder can be represented by Structure (VIII) described above in which x is from about 5 to about 30 weight % (more preferably, from about 5 to about 20 weight %) and B represents recurring units derived from:

a) one or more of styrene, N-phenylmaleimide, methacrylic acid, and methyl methacrylate, wherein these recurring units comprise from 0 to about 70 weight % (more preferably from about 10 to about 50 weight %) of all recurring units in the solvent-resistant polymer, and b) one or more of acrylonitrile or methacrylonitrile, or mixtures thereof, wherein these recurring units comprise from about 20 to about 95 weight % (more preferably from about 20 to about 60 weight %) of all recurring units in the solvent-resistant polymer.

Other useful first polymeric binders comprise a backbone and have attached to the backbone the following Structure Q group:

(Q)

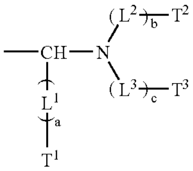

wherein $L^1$, $L^2$, and $L^3$ independently represent linking groups, $T^1$, $T^2$, and $T^3$ independently represent terminal groups, and a, b, and c are independently 0 or 1.

More particularly, each of $L^1$, $L^2$, and $L^3$ is independently a substituted or unsubstituted alkylene having 1 to 4 carbon atoms (such as methylene, 1,2-ethylene, 1,1-ethylene, n-propylene, iso-propylene, t-butylene, and n-butylene groups), substituted cycloalkylene having 5 to 7 carbon atoms in the cyclic ring (such as cyclopentylene and 1,4-cyclohexylene), substituted or unsubstituted arylene having 6 to 10 carbon atoms in the aromatic ring (such as 1,4-phenylene, naphthylene, 2-methyl-1,4-phenylene, and 4-chloro-1,3-phenylene groups), or substituted or unsubstituted, aromatic or non-aromatic divalent heterocyclic group having 5 to 10 carbon and one or more heteroatoms in the cyclic ring (such as pyridylene, pyrazylene, pyrimidylene, or thiazolylene groups), or any combinations of two or more of these divalent linking groups. Alternatively, $L^2$ and $L^3$ together can represent the necessary atoms to form a carbocyclic or heterocyclic ring structure. Preferably, $L^1$ is a carbon-hydrogen single bond or a methylene, ethylene, or phenylene group, and $L^2$ and $L^3$ are independently hydrogen, methyl, ethyl, 2-hydroxyethyl, or cyclic $—(CH_2)_2O(CH_2CH_2)—$ groups.

$T^1$, $T^2$, and $T^3$ are independently terminal groups such as hydrogen, or substituted or unsubstituted alkyl groups having 1 to 10 carbon atoms (such as methyl, ethyl, iso-propyl, t-butyl, n-hexyl, methoxymethyl, phenylmethyl, hydroxyethyl, and chloroethyl groups), substituted or unsubstituted alkenyl groups having 2 to 10 carbon atoms (such as ethenyl and hexenyl groups), substituted or unsubstituted alkynyl groups (such as ethynyl and octynyl groups), substituted or unsubstituted cycloalkyl groups having 5 to 7 carbon atoms in the cyclic ring (such as cyclopentyl, cyclohexyl, and cycloheptyl groups), substituted or unsubstituted heterocyclic groups (both aromatic and non-aromatic) having a carbon atom and one or more heteroatoms in the ring (such as pyridyl, pyrazyl, pyrimidyl, thiazolyl, and indolyl groups), and substituted or unsubstituted aryl groups having 6 to 10 carbon atoms in the aromatic ring (such as phenyl, naphthyl, 3-methoxyphenyl, benzyl, and 4-bromophenyl groups). Alternatively, $T^2$ and $T^3$ together represent the atoms necessary to form a cyclic structure that can also contain fused rings. In addition, when "a" is 0, $T^3$ is not hydrogen.

In some embodiments, the Structure Q group can be directly attached to an α-carbon atom in the polymer backbone, the α-carbon atom also having attached thereto an electron withdrawing group. In other embodiments, the Structure Q group is indirectly attached to the polymer backbone through a linking group.

These first polymeric binders can be prepared by the reaction of an α-hydrogen in the polymer precursor with a first compound comprising an aldehyde group and a second compound comprising an amine group as described in U.S. Patent Application Publication 2005/0037280 (Loccufier et al.), incorporated herein by reference.

These first polymeric binders can contain more than one type of substituted Structure Q group. The different Structure Q groups can be incorporated successively or as a mixture of different first and second compounds in the reaction with the hydroxy-containing polymer. The amount and type of Structure Q group is limited only by the solubility of the resulting modified resin binder in the alkaline developer. Generally, at least 1 mol % and up to 99 mol % of the first polymeric binder recurring units comprise the same or different Structure Q groups.

The first polymeric binders can also be represented by the following Structure (X):

$$-(A)_x-(B)_y- \qquad (X)$$

wherein A represents recurring units derived from one or more ethylenically unsaturated polymerizable monomers that comprise the same or different Q groups, B represents recurring units derived from one or more different ethylenically unsaturated polymerizable monomers that do not comprise Q groups.

More particularly, the A recurring units in Structure X can be represented by the following Structure (Xa) or (Xb):

(Xa)

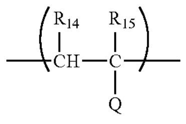

(Xb)

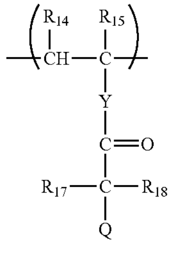

wherein $R_{14}$ and $R_{16}$ are independently hydrogen or a halo, substituted or unsubstituted alkyl having 1 to 7 carbon atoms (such as methyl, ethyl, n-propyl, iso-propyl, or benzyl), or a substituted or unsubstituted phenyl group. Preferably, $R_{14}$ and $R_{16}$ are independently hydrogen or a methyl or halo group, and more preferably they are independently hydrogen or methyl.

$R_{15}$ in Structure Xa is an electron withdrawing group as defined above including but are not limited to, cyano, nitro, substituted or unsubstituted aryl groups having 6 to 10 carbon atoms in the carbocyclic ring, substituted or unsubstituted heteroaryl groups having 5 to 10 carbon, sulfur, oxygen, or nitrogen atoms in the heteroaromatic ring, $—C(=O)OR_{20}$, and $—C(=O)R_{20}$ groups wherein $R_{20}$ is hydrogen or a substituted or unsubstituted alkyl having 1 to 4 carbon atoms (such as methyl, ethyl, n-propyl, t-butyl), a substituted or unsubstituted cycloalkyl (such as a substituted or unsubstituted cyclohexyl), or a substituted or unsubstituted aryl group (such as substituted or unsubstituted phenyl). The cyano, nitro, $—C(=O)OR_{20}$, and $—C(=O)R_{20}$ groups are preferred and cyano, $—C(=O)CH_3$, and $—C(=O)OCH_3$ are most preferred.

$R_{17}$ and $R_{18}$ in Structure (Xb) are independently hydrogen or a substituted or unsubstituted alkyl group having 1 to 6 carbon atoms (such as such as methyl, ethyl, n-propyl, t-butyl, n-hexyl), substituted or unsubstituted cycloalkyl having 5 or 6 carbon atoms (such as cyclohexyl), a substituted or unsubstituted aryl group having 6 to 10 carbon atoms (such as phenyl, 4-methylphenyl, and naphthyl), or a $—C(=O)R_{19}$ group wherein $R_{19}$ is a substituted or unsubstituted alkyl group (as defined for $R_{17}$ and $R_{18}$), a substituted or unsubstituted alkenyl group having 2 to 8 carbon atoms (such as ethenyl and 1,2-propenyl), a substituted or unsubstituted cycloalkyl group (as defined above for $R_{17}$ and $R_{18}$), or a substituted or unsubstituted aryl group (as defined above for $R_{17}$ and $R_{18}$). Preferably, $R_{17}$ and $R_{18}$ are independently hydrogen or a substituted or unsubstituted alkyl, cycloalkyl, aryl, or $—C(=O)R_{19}$ groups as defined above wherein $R_{19}$ is an alkyl having 1 to 4 carbon atoms.

In Structure (Xb), Y is a direct bond or a divalent linking group. Useful divalent linking groups include but are not limited to oxy, thio, $—NR_{21}—$, substituted or unsubstituted alkylene, substituted or unsubstituted phenylene, substituted or unsubstituted heterocyclylene, $—C(=O)—$, and $—C(=O)O—$ groups, or a combination thereof wherein $R_{21}$ is hydrogen or a substituted or unsubstituted alkyl, substituted or unsubstituted cycloalkyl, or substituted or unsubstituted aryl group, as defined above for $R_{17}$ and $R_{18}$. Preferably, Y is a direct bond or an oxy, $—C(=O)O—$, $—C(=O)OCH_2CH_2O—$, or $—C(=O)CH_2CH_2C(=O)CH_2—$ group.

In Structure (X), x is from about 1 to about 70 mol %, and y is from about 30 to about 99 mol %, based on total recurring units. Preferably, x is from about 5 to about 50 mol % and y is from about 50 to about 95 mol %, based on total recurring units.

Also in Structure (X), B can represent recurring units derived from a wide variety of ethylenically unsaturated polymerizable monomers. Particularly useful recurring units are derived from one or more N-substituted maleimides, N-substituted (meth)acrylamides, unsubstituted (meth)acrylamides, (meth)acrylonitriles, or vinyl monomers having an acidic group, and more preferably from one or more N-phenylmaleimides, N-cyclohexylmaleimides, N-benzylmaleimides, N-(4-carboxyphenyl)maleimides, (meth)acrylic acids, vinyl benzoic acids, (meth)acrylamides, and (meth)acrylonitriles. Several of these monomers can be copolymerized to provide multiple types of B recurring units. Particularly useful combinations of B recurring units include those derived from two or more of methacrylic acid, methacrylamide, and N-phenylmaleimide.

The first polymeric binders are the predominant polymeric materials in the inner layer. That is, they comprise more than 50% and up to 100% (dry weight) of the total polymeric materials in the inner layer. However, the inner layer may also comprise one or more primary additional polymeric materials, provided these primary additional polymeric materials do not adversely affect the chemical resistance and solubility properties of the inner layer.

Useful primary additional polymeric materials include copolymers that comprises from about 1 to about 30 mole % and preferably from about 3 to about 20 mole % of recurring units derived from N-phenylmaleimide, from about 1 to about 30 mole % and preferably from about 5 to about 20 mole % of recurring units derived from methacrylamide, from about 20 to about 75 mole % and preferably from about 35 to about 60 mole % of recurring units derived from acrylonitrile, and from about 20 to about 75 mole % and preferably from about 35 to about 60 mole % of recurring units derived from one or more monomers of the Structure (XI):

$$CH_2{=}C(R_{23}){-}CO_2{-}CH_2CH_2{-}NH{-}CO{-}NH\text{-}p\text{-}C_6H_4{-}R_{22} \quad \text{(XI)}$$

wherein $R_{22}$ is OH, COOH, or $SO_2NH_2$, and $R_{23}$ is H or methyl, and, optionally, from about 1 to about 30 mole % and preferably, when present, from about 3 to about 20 mole % of recurring units derived from one or more monomers of the Structure (XII):

$$CH_2{=}C(R_{25}){-}CO{-}NH\text{-}p\text{-}C_6H_4{-}R_{24} \quad \text{(XII)}$$

wherein $R_{24}$ is OH, COOH, or $SO_2NH_2$, and $R_{25}$ is H or methyl.

The inner layer may also comprise one or more secondary additional polymeric materials that are resins having activated methylol and/or activated alkylated methylol groups. These "secondary additional polymeric materials" in the inner layer should not be confused as the "second polymeric binder" used in the outer layer.

The secondary additional polymeric materials can include, for example resole resins and their alkylated analogs, methylol melamine resins and their alkylated analogs (for example melamine-formaldehyde resins), methylol glycoluril resins and alkylated analogs (for example, glycoluril-formaldehyde resins), thiourea-formaldehyde resins, guanamine-formaldehyde resins, and benzoguanamine-formaldehyde resins. Commercially available melamine-formaldehyde resins and glycoluril-formaldehyde resins include, for example, CYMEL® resins (Dyno Cyanamid) and NIKALAC® resins (Sanwa Chemical).

The resin having activated methylol and/or activated alkylated methylol groups is preferably a resole resin or a mixture of resole resins. Resole resins are well known to those skilled in the art. They are prepared by reaction of a phenol with an aldehyde under basic conditions using an excess of phenol. Commercially available resole resins include, for example, GP649D99 resole (Georgia Pacific) and BKS-5928 resole resin (Union Carbide).

Useful secondary additional polymeric materials can also include copolymers that comprise from about 25 to about 75 mole % and about 35 to about 60 mole % of recurring units derived from N-phenylmaleimide, from about 10 to about 50 mole % and preferably from about 15 to about 40 mole % of recurring units derived from methacrylamide, and from about 5 to about 30 mole % and preferably from about 10 to about 30 mole % of recurring units derived from methacrylic acid. These secondary additional copolymers are disclosed in U.S. Pat. Nos. 6,294,311 and 6,528,228 (both noted above).

The first polymeric binder and the primary and secondary additional polymeric materials useful in the inner layer can be prepared by methods, such as free radical polymerization, that are well known to those skilled in the art and that are described, for example, in Chapters 20 and 21, of *Macromolecules*, Vol. 2, 2nd Ed., H. G. Elias, Plenum, N.Y., 1984. Useful free radical initiators are peroxides such as benzoyl peroxide, hydroperoxides such as cumyl hydroperoxide and azo compounds such as 2,2'-azobis(isobutyronitrile) (AIBN). Suitable reaction solvents include liquids that are inert to the reactants and that will not otherwise adversely affect the reaction.

In preferred embodiments, the inner layer further comprises an infrared radiation absorbing compound ("IR absorbing compounds") that absorbs radiation at from about 600 to about 1200 and preferably at from about 700 to about 1200 nm, with minimal absorption at from about 300 to about 600 nm. This compound (sometimes known as a "photothermal conversion material") absorbs radiation and converts it to heat. Although one of the polymeric materials may itself comprise an IR absorbing moiety, typically the infrared radiation absorbing compound is a separate compound. This compound may be either a dye or pigments such as iron oxides and carbon blacks. Examples of useful pigments are ProJet 900, ProJet 860 and ProJet 830 (all available from the Zeneca Corporation).

Useful infrared radiation absorbing compounds also include carbon blacks including carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful.

IR absorbing dyes (especially those that are soluble in an alkaline developer) are more preferred to prevent sludging of the developer by insoluble material. Examples of suitable IR dyes include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indoaniline dyes, merostyryl dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in numerous publications including U.S. Pat. No. 6,294,311 (noted above) and U.S. Pat. No. 5,208,135 (Patel et al.) and the references cited thereon, that are incorporated herein by reference.

Examples of useful IR absorbing compounds include ADS-830A and ADS-1064 (American Dye Source, Baie D'Urfe, Quebec, Canada), EC2117 (FEW, Wolfen, Germany), Cyasorb® IR 99 and Cyasorb® IR 165 (GPTGlendale Inc. Lakeland, Fla.), and IR Absorbing Dye A used in the Examples below.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), U.S. Pat. No. 5,496,903 (Watanate et al.). Suitable dyes may be formed using conventional methods and starting materials or obtained from various commercial sources including American Dye Source (Canada) and FEW Chemicals (Germany). Other useful dyes for near infrared diode laser beams are described, for example, in U.S. Pat. No. 4,973,572 (DeBoer).

In addition to low molecular weight IR-absorbing dyes, IR dye moieties bonded to polymers can be used as well. Moreover, IR dye cations can be used, that is, the cation is the IR absorbing portion of the dye salt that ionically interacts with a polymer comprising carboxy, sulfo, phosphor, or phosphono groups in the side chains.

The infrared radiation absorbing compound can be present in the imageable element in an amount of generally at least 5% and up to 30% and preferably from about 12 to about 25%, based on the total dry weight of the element. Preferably, this amount is based on the total dry weight of the layer in which it is located. The particular amount of a given compound to be used could be readily determined by one skilled in the art.

The inner layer can include other components such as surfactants, dispersing aids, humectants, biocides, viscosity builders, drying agents, defoamers, preservatives, antioxidants, and colorants.

The inner layer generally has a dry coating coverage of from about 0.5 to about 2.5 g/m$^2$ and preferably from about 1 to about 2 g/m$^2$. The first polymeric binders described above generally comprise at least 50 weight % and preferably from about 60 to about 90 weight % based on the total dry layer weight, and this amount can be varied depending upon what other polymers and chemical components are present. Any primary and secondary additional polymeric materials (such as a novolak, resole, or copolymers noted above) can be present in an amount of from about 5 to about 45 weight % and preferably from about 5 to about 25 weight % based on the total dry weight of the inner layer.

The outer layer of the imageable element is disposed over the inner layer and in preferred embodiments there are no intermediate layers between the inner and outer layers. The outer layer comprises a second polymeric material that is different than the first polymeric binder described above. It is generally a light-stable, water-insoluble, alkaline developer soluble, film-forming binder material as defined below. The outer layer is substantially free of infrared radiation absorbing compounds, meaning that none of these compounds are purposely incorporated therein and insubstantial amounts diffuse into it from other layers.

The second polymeric binder comprises recurring units having pendant carboxy groups that are generally represented by the following Structure (I) or (II), which recurring units comprise at least 3 mol % of the total recurring units in the second polymeric binder:

(I)

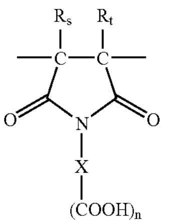

(II)

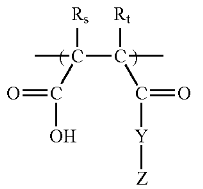

wherein n is 1 to 3 (preferably 1 or 2 and more preferably 1).

In Structure (I) or (II), $R_s$ and $R_t$ are independently hydrogen or a substituted or unsubstituted alkyl group having 1 to 7 carbon atoms (such as methyl, ethyl, t-butyl, or benzyl), or a halo group (such as chloro or bromo). Preferably, $R_s$ and $R_t$ are independently hydrogen or a substituted or unsubstituted methyl group or chloro group, and more preferably, they are independently hydrogen or a methyl group.

X is a multivalent linking group including but not limited to multivalent aliphatic and aromatic linking groups, and combinations thereof. In most embodiments, X is a divalent linking group. Such groups can include alkylene, arylene, alkylenearylene, arylenealkylene, alkyleneoxyalkylene, aryleneoxyarylene, and alkyleneoxyarylene groups, all of which can be unsubstituted or substituted with one or more substituents that do not adversely affect the performance of the second polymeric binder. Preferably, X is a substituted or unsubstituted phenylene group, especially when n is 1.

In Structure (II), Y is oxy or —NR— wherein R is hydrogen or a substituted or unsubstituted alkyl group having 1 to 10 carbon atoms (such as methyl, ethyl, iso-propyl, n-hexyl, and benzyl groups) or substituted or unsubstituted aryl group (such as a phenyl group). Preferably Y is an oxy group.

Also in Structure (II), Z is a monovalent organic group including but not limited to, a monovalent aliphatic or aromatic group, or a combination thereof. Such groups are defined similar to the multivalent groups described above for X but can also include arylene or alkylene groups, or combinations thereof, with or without carbonyl groups [C(═O)] or amido groups (—NH—) groups, or combinations thereof. For example, useful Z groups include —R'—NHC(═O)R" groups wherein R' is a substituted or unsubstituted alkylene group having 2 to 6 carbon atoms (such as ethylene and iso-propylene), and R" is a substituted or unsubstituted alkyl group having 1 to about 10 carbon atoms (such as methyl, methoxymethyl, ethyl, iso-propyl, n-hexyl, and benzyl groups) or a substituted or unsubstituted aryl group (such as a phenyl group). One particularly useful Z group is a —$CH_2CH_2NHC$(═O)-phenyl group.

Z can also be a substituted or unsubstituted alkyl group having 1 to 10 carbon atoms (such as methyl, ethyl, iso-propyl, t-butyl, n-hexyl, and benzyl groups). Particularly useful alkyl groups for Z include those having 1 to 8 carbon atoms (including straight-chain and branched butyl groups).

The second polymeric binder generally has an acid number of at least 20 mg KOH/g and preferably an acid number of from about 25 to about 45 mg KOH/g. To change the acidity of the second polymeric binder, the amount of pending carboxylic acid groups can be adjusted (for example, reduced) by reaction with an oxazoline, or by esterification with an alcohol or alkylhalogenide using known methods.

The second polymeric binder also generally has a number average molecular weight of at least 1,000 and up to 250,000, and preferably from about 10,000 to about 150,000 as measured using known techniques.

The second polymeric binder can also be represented by the following Structure (III):

$$-(A)_x-(B)_y- \quad \text{(III)}$$

wherein A represents recurring units defined by either Structure (I) or (II) or both Structures (I) and (II). Thus, multiple types of monomers can be used to provide the A recurring units.

Also in Structure (III), x is about 3 to about 15 mol % (preferably from about 5 to about 10 mol %), and y is from about 85 to about 97 mol % (preferably from about 90 to about 95 mol %).

In Structure (III), B represents recurring units other than those represented by A. They can be derived from one or more ethylenically unsaturated polymerizable monomers that are capable of copolymerizing with the monomers from which the A recurring units are derived, including maleic acid anhydride. Representative useful monomers for the B recurring units include but are not limited to, (meth)acrylates, (meth)acrylamides, vinyl ethers, vinyl esters, vinyl ketones, olefins, unsaturated imides including N-maleimides, unsaturated anhydrides such as maleic anhydrides, N-vinyl pyrrolidone, N-vinyl carbazole, 4-vinyl pyridine, (meth)acrylonitriles, or styrenic monomers, or any combinations of these monomers. Specific monomers of these and similar classes are described for example, in paragraphs [0044] through [0054] of U.S. Patent Application Publication 2004/0137366 (corresponding to EP 1,433,594A) that is incorporated herein by reference.

Preferably, B represents recurring units for Structure (III) that are derived from one or more (meth)acrylates, (meth) acrylonitriles, N-phenylmaleimide, or (meth)acrylamides such as N-alkoxyalkylmethacrylamides, or combinations of two or more of such monomers. Some particularly useful monomers from which B recurring units are derived include methyl methacrylate, styrene, ethylenically unsaturated polymerizable monomers having pendant cyclic urea groups, and combinations thereof.

The second polymeric binders useful in this invention can be prepared using a variety of methods. For example, maleimide polymers with pendant carboxylic acid groups can be readily prepared by free radical polymerization of the maleimide monomers corresponding to the recurring units of Structure (I) using a conventional radical initiator [such as 2,2'-azobis(isobutyronitrile) or AIBN], or by imidization of the corresponding amine with the anhydride copolymer, in suitable solvents that are inert to the reactants. Polymers comprising Structure (II) recurring units can be obtained by polymerization of maleic anhydride and the subsequent reaction with an alcohol or secondary amine. The reactants and conditions for these reactions would be readily apparent to one skilled in the art, for example as described in Chapters 20 and 21 of *Macromolecules*, Vol. 2, $2^{nd}$ Ed. by H. G. Elias, Plenum, N.Y. 1984. Representative synthetic methods for making most preferred Copolymers 1–3 are provided below before the Examples. Polymers containing Formula (II) recurring units are also available as commercial products such as Scripset® 540 styrene-maleic anhydride copolymers (available from Hercules, Wilmington, Del.). The second polymeric binders can be homopolymers or copolymers as those terms are understood in the art.

The second polymeric binder is generally present in the outer layer at a dry coverage of from about 1 to 100 weight %, and preferably from about 85 to 100 weight %, based on total dry weight of that layer.

The outer layer can optionally include colorants. Particularly useful colorants are described for example in U.S. Pat. No. 6,294,311 (noted above) including triarylmethane dyes such as ethyl violet, crystal violet, malachite green, brilliant green, Victoria blue B, Victoria blue R, and Victoria pure blue BO. These compounds can act as contrast dyes that distinguish the unimaged areas from the imaged areas in the developed imageable element.

The outer layer can optionally also include contrast dyes, printout dyes, coating surfactants, dispersing aids, humectants, biocides, viscosity builders, drying agents, defoamers, preservatives, and antioxidants. Coating surfactants are particularly useful.

The outer layer generally has a dry coating coverage of from about 0.2 to about 1 $g/m^2$ and preferably from about 0.4 to about 0.7 $g/m^2$.

Although not preferred, there may be a separate layer that is in between and in contact with the inner and outer layers. This separate layer can act as a barrier to minimize migration of radiation absorbing compound(s) from the inner layer to the outer layer. This separate "barrier" layer generally comprises a third polymeric binder that is soluble in the alkaline developer. If this third polymeric binder is different from the first polymeric binder(s) in the inner layer, it is preferably soluble in at least one organic solvent in which the inner layer first polymeric binders are insoluble. A preferred third polymeric binder is a poly(vinyl alcohol). Generally, this barrier layer should be less than one-fifth as thick as the inner layer, and preferably less than one-tenth as thick as the inner layer.

Preparation of the Imageable Element

The imageable element can be prepared by sequentially applying an inner layer formulation over the surface of the substrate (and any other hydrophilic layers provided thereon), and then applying an outer layer formulation over the inner layer using conventional coating or lamination methods. It is important to avoid intermixing of the inner and outer layer formulations.

The inner and outer layers can be applied by dispersing or dissolving the desired ingredients in a suitable coating solvent, and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support (such as an on-press printing cylinder).

The selection of solvents used to coat both the inner and outer layers depends upon the nature of the first and second polymeric binders, other polymeric materials, and other components in the formulations. To prevent the inner and outer layer formulations from mixing or the inner layer from dissolving when the outer layer formulation is applied, the outer layer formulation should be coated from a solvent in which the first polymeric binder(s) of the inner layer are insoluble.

Generally, the inner layer formulation is coated out of a solvent mixture of methyl ethyl ketone (MEK), 1-methoxy-2-propyl acetate (PMA), γ-butyrolactone (BLO), and water, a mixture of MEK, BLO, water, and 1-methoxypropan-2-ol (also known as Dowanol PM or PGME), a mixture of diethyl ketone (DEK), water, methyl lactate, and BLO, a mixture of DEK, water, and methyl lactate, or a mixture of methyl lactate, methanol, and dioxolane.

The outer layer formulation can be coated out of solvents or solvent mixtures that do not dissolve the inner layer. Typical solvents for this purpose include but are not limited to, butyl acetate, iso-butyl acetate, methyl iso-butyl ketone, DEK, 1-methoxy-2-propyl acetate (PMA), iso-propyl alcohol, PGME and mixtures thereof. Particularly useful is a mixture of DEK and PMA, or a mixture of DEK, PMA, and isopropyl alcohol.

Alternatively, the inner and outer layers may be applied by extrusion coating methods from melt mixtures of the respective layer compositions. Typically, such melt mixtures contain no volatile organic solvents.

Intermediate drying steps may be used between applications of the various layer formulations to remove solvent(s) before coating other formulations. Drying steps may also help in preventing the mixing of the various layers.

After drying the layers, the element can be further "conditioned" with a heat treatment at from about 40 to about 90° C. for at least 4 hours (preferably at least 20 hours) under conditions that inhibit the removal of moisture from the dried layers. More preferably, the heat treatment is carried out at from about 50 to about 70° C. for at least 24 hours. During the heat treatment, the imageable element is wrapped or encased in a water-impermeable sheet material to represent an effective barrier to moisture removal from the precursor, or the heat treatment of the imageable element is carried out in an environment in which relative humidity is controlled to at least 25%. In addition, the water-impermeable sheet material can be sealed around the edges of the imageable element, with the water-impermeable sheet material being a polymeric film or metal foil that is sealed around the edges of the imageable element.

In some embodiments, this heat treatment can be carried out with a stack comprising at least 100 of the same imageable elements, or when the imageable element is in the form of a coil.

Representative methods for preparing imageable elements of this invention are shown in Examples 1–5 below.

The imageable elements can have any useful form including, but not limited to, printing plate precursors, printing cylinders, printing sleeves and printing tapes (including flexible printing webs). Preferably, the imageable members are printing plate precursors useful for providing lithographic printing plates.

Printing plate precursors can be of any useful size and shape (for example, square or rectangular) having the requisite inner and outer layers disposed on a suitable substrate. Printing cylinders and sleeves are known as rotary printing members having the substrate and inner and outer layers in a cylindrical form. Hollow or solid metal cores can be used as substrates for printing sleeves.

Imaging and Development

During use, the imageable element is exposed to a suitable source of infrared using an infrared laser at a wavelength of from about 600 to about 1500 nm and preferably from about 700 to about 1200 nm. The lasers used to expose the imageable elements are preferably diode lasers, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1040 to about 1120 nm.

The imaging apparatus can function solely as a platesetter or it can be incorporated directly into a lithographic printing press. In the latter case, printing may commence immediately after imaging, thereby reducing press set-up time considerably. The imaging apparatus can be configured as a flatbed recorder or as a drum recorder, with the imageable member mounted to the interior or exterior cylindrical surface of the drum. Examples of useful imaging apparatus are available as models of Creo Trendsetter® imagesetters available from Creo Corporation (a subsidiary of Eastman Kodak Company, Burnaby, British Columbia, Canada) that contain laser diodes that emit near infrared radiation at a wavelength of about 830 nm. Other suitable imaging sources include the Crescent 42T Platesetter that operates at a wavelength of 1064 nm and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging speeds may be in the range of from about 50 to about 1500 $mJ/cm^2$, and more particularly from about 75 to about 400 $mJ/cm^2$.

While laser imaging is preferred in the practice of this invention, imaging can be provided by any other means that provides thermal energy in an imagewise fashion. For example, imaging can be accomplished using a thermoresistive head (thermal printing head) in what is known as "thermal printing", as described for example in U.S. Pat. No. 5,488,025 (Martin et al.) and as used in thermal fax machines and sublimation printers. Thermal print heads are commercially available (for example, as a Fujitsu Thermal Head FTP-040 MCS001 and TDK Thermal Head F415 HH7-1089).

Imaging is generally carried out by direct digital imaging. The image signals are stored as a bitmap data file on a computer. Such files may be generated by a raster image processor (RIP) or other suitable means. The bitmaps are constructed to define the hue of the color as well as screen frequencies and angles.

Imaging of the imageable element produces an imaged element that comprises a latent image of imaged (exposed) and non-imaged (non-exposed) regions. Developing the imaged element with a suitable alkaline developer removes the exposed regions of the outer layer and the underlying layers (including the inner layer), and exposes the hydrophilic surface of the substrate. Thus, the imageable elements of this invention are "positive-working". The exposed (or imaged) regions of the hydrophilic surface repel ink while the non-exposed (or non-imaged) regions of the outer layer accept ink.

More particularly, development is carried out for a time sufficient to remove the imaged (exposed) regions of the outer layer and underlying layers, but not long enough to remove the non-imaged (non-exposed) regions of the outer layer. Thus, the imaged (exposed) regions of the outer layer are described as being "soluble" or "removable" in the alkaline developer because they are removed, dissolved, or dispersed within the alkaline developer more readily than the non-imaged (non-exposed) regions of the outer layer. Thus, the term "soluble" also means "dispersible". Because of the nature of the second polymer binder(s) used in the outer layer, removal of the exposed regions readily occurs during development but the removed portions of the outer layer stay suspended or soluble in the developer solution for a longer period of time.

The imaged elements are generally developed using conventional processing conditions. Both aqueous alkaline developers and solvent-based alkaline developers can be used with the latter type of alkaline developers being preferred.

Particularly useful developers for use in the present invention are solvent-based alkaline developers that are generally single-phase solutions of one or more organic solvents that are miscible with water. Useful organic solvents can contain the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, or ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 to about 15% based on total developer weight. It is particularly desirable that the alkaline developer contains one or more thiosulfate salts or amino compounds that include at least one N-hydrogen atom and an alkyl group that is substituted with a hydrophilic group such as a hydroxy group, polyethylene oxide chain, or an acidic group having a pKa less than 7 (more preferably less than 5) or their corresponding salts (such as carboxy, sulfo, sulfonate, sulfate, phosphonic acid, and phosphate groups). Particularly useful amino compounds of this type include, but are not limited to, monoethanolamine, diethanolamine, glycine, alanine, aminoethylsulfonic acid and its salts, aminopropylsulfonic acid and its salts, and Jeffamine compounds (for example, an amino-terminated polyethylene oxide).

Representative solvent-based negative alkaline developers include ND-1 Developer, 955 Developer, 989 Developer, 980 Developer, and 956 Developer (available from Kodak Polychrome Graphics, a subsidiary of Eastman Kodak Company). These negative developers can be used to advantage in the methods of this invention minimal residue left after development of the imaged elements provided by this invention.

Another useful developer is the positive alkaline developer W129 C3A developer that is described below. Minimal residue is left after using this developer.

Aqueous alkaline developers generally have a pH of at least 7 and preferably of at least 11. Useful alkaline aqueous developers include 3000 Developer, 9000 Developer, GOLDSTAR Developer, GREENSTAR Developer, ThermalPro Developer, PROTHERM Developer, MX1813 Developer, and MX1710 Developer (all available from Kodak Polychrome Graphics, a subsidiary of Eastman Kodak Company). These compositions also generally include surfactants, chelating agents (such as salts of ethylenediaminetetraacetic acid), and alkaline components (such as inorganic metasilicates, organic metasilicates, hydroxides, and bicarbonates) and optionally solvents.

Generally, the alkaline developer is applied to the imaged element by rubbing or wiping the outer layer with an applicator containing the developer. Alternatively, the imaged element can be brushed with the developer or the developer may be applied by spraying the outer layer with sufficient force to remove the exposed regions. The imaged element is preferably immersed in the developer. In all instances, a developed image is produced, particularly in a lithographic printing plate.

Following development, the imaged element can be rinsed with water and dried in a suitable fashion. The dried element can also be treated with a conventional gumming solution (preferably gum arabic).

The imaged and developed element can also be baked in a postbake operation that can be carried out to increase run length of the resulting imaged element. Baking can be carried out, for example at from about 220° C. to about 240° C. for from about 7 to about 10 minutes, or at about 120° C. for 30 minutes.

A lithographic ink and fountain solution can be applied to the printing surface of the imaged element for printing. The ink is taken up by the non-imaged (non-exposed or unremoved) regions of the outer layer and the fountain solution is taken up by the hydrophilic surface of the substrate revealed by the imaging and development process. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means and chemicals.

The following examples are provided to illustrate the practice of the invention but are by no means intended to limit the invention in any manner.

EXAMPLES

The components and materials used in the examples and analytical methods were as follows:

MEK is methyl ethyl ketone.

DEK is diethyl ketone.

PGME is 1-methoxypropan-2-ol (also known as Dowanol PM).

BLO is γ-butyrolactone.

PMA is 1-methoxy-2-propyl acetate.

DMAC is dimethylacetamide.

IR Dye A was obtained from Eastman Kodak Company and is represented by the following formula:

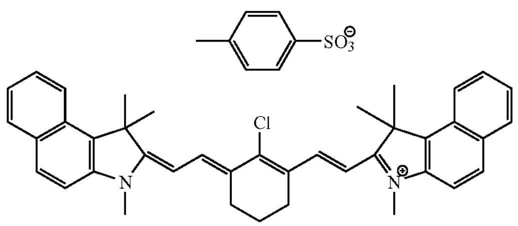

IR Dye A

IR Dye B was Kayabsorb PS210CNE that is an infrared absorbing dye (Nippon Kayaku Co, Ltd., Japan).

IR Dye C was supplied by Eastman Kodak (Rochester, N.Y.) and has the following formula:

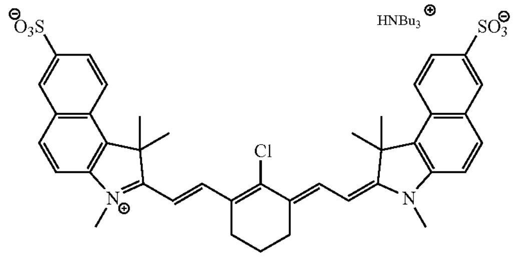

IR Dye C

Polymer A is a copolymer having recurring units derived from N-phenylmaleimide (41.5 mol %), methacrylamide (37.5 mol %), and methacrylic acid (21 mol %) that was obtained from Clariant (Germany).

Polymer B is a copolymer having recurring units derived from N-phenylmaleimide (40 mol %), methacrylamide (19 mol %), methacrylic acid (15 mol %), and N-(2-methacryloyloxyethyl)ethylene (26 mol %) and had an acid number of 57.

Polymer C is a polymer having the following structure:

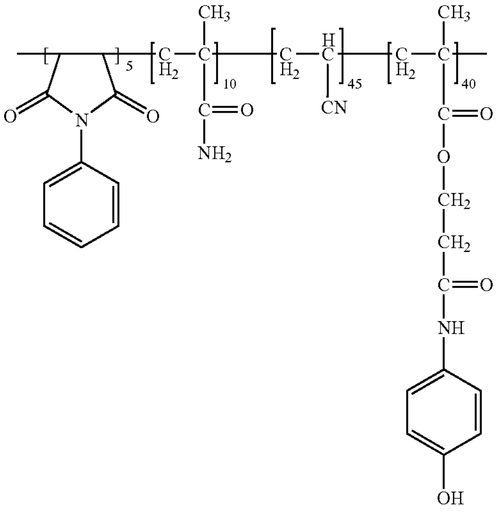

Scripset® 540 is a copolymer derived from styrene and the butyl ester of maleic acid anhydride (Monsanto).

GP Resole is bis-Phenol A Resole (Georgia Pacific Chemicals, Atlanta, Ga.).

JK58 was a poly(N-phenylmaleimide-co-methacrylamide-co-methacrylic acid) (50:35:15 mol %) from Clariant (Germany).

ACR1755 was poly(benzoic acid methacrylamide-co-acrylonitrile-co-methacrylamide-co-N-phenylmaleimide) (37:48:10:5 weight %).

Ethyl violet is C.I. 42600 (CAS 2390-59-2, $\lambda_{max}$=596 nm) having a formula of $(p-(CH_3CH_2)_2NC_6H_4)_3C^+Cl^-$ (Aldrich Chemical Company, Milwaukee, Wis., USA).

Byk® 307 is a polyethoxylated dimethylpolysiloxane copolymer that is available from Byk Chemie (Wallingford, Conn.) in a 25 wt. % xylene/-methoxypropyl acetate solution.

Substrate A is a 0.3 mm gauge aluminum sheet that had been electrograined, anodized, and subjected to treatment poly(vinyl phosphonic acid). 989 Developer, 956 Developer, 980 Developer, and ND1 Developer are negative developers available from Kodak Polychrome Graphics (Norwalk, Conn., a subsidiary of Eastman Kodak Company).

W129 C3A is a solvent-based positive developer containing sodium metasilicate, Dowanol EPH, and diethanolamine (pH 13).

The following polymers were prepared and used in the outer layers for some of the imageable elements described in the Examples:

Synthesis of Copolymer 1:

To a 3-necked round-bottomed flask fitted with stirrer, nitrogen inlet, and condenser, were added methyl ethyl ketone (150 g) and dimethyl-acetamide (10 g) that were then heated to 85° C. To this solvent mixture, methyl methacrylate (46.55 g) and N-(4-carboxyphenyl) maleimide (7.6 g) were then added and dissolved. After flushing thoroughly for 15 minutes with nitrogen, AIBN (0.12 g) was added and the nitrogen pressure was reduced. After 1 hour of reaction, AIBN (0.7 g) was again added and the reaction was continued for 3 hours at 85° C. The solution was precipitated in 600 ml of petroleum ether (Waschbenzin 135/180). The resulting Copolymer 1 was filtered and dried at 40° C. in a vacuum oven. The acid number of Copolymer 1 was found to be 35.

Synthesis of Copolymer 2:

To Scripset® 540 copolymer (20 g) dissolved in methyl glycol acetate (200 g) was added ethyl oxazoline (15 g). The solution was heated under nitrogen for 6 hours at 110° C. The resulting Copolymer 2 was precipitated in water, washed, and dried at 40° C. in a vacuum oven. The dried Copolymer 2 was found to have an acid number of 33.

Synthesis of Copolymer 3:

To a 3-necked round-bottomed flask fitted with stirrer, nitrogen inlet, and condenser, were added MEK (150 g) and DMAC (10 g) that were heated to 85° C. To this solvent mixture, methyl methacrylate (46.55 g) and maleic acid anhydride (3.43 g) were then added and dissolved. After flushing thoroughly for 15 minutes with nitrogen, AIBN (0.12 g) was added and the nitrogen pressure was reduced. After 1 hour, AIBN (0.70 g) was again added and the reaction was continued for 3 hours at 85° C. To this solution n-butanol (2.59 g) was added followed by triethylamine (0.26 g) and it was further heated for 2 hours at 85° C. and overnight at room temperature. The solution was then precipitated in 600 ml of petroleum ether (Waschbenzin 135/180), and the resulting Copolymer 3 was filtered and dried at 40° C. in a vacuum oven. The acid number of Copolymer 3 was determined to be 34.

Example 1

A positive-working imageable of this invention was prepared as follows. An inner layer formulation (6% solids) was prepared by dissolving the following components shown in TABLE I in a solvent mixture comprising MEK (45%), PMA (35%), BLO (10%), and water (10%).

TABLE I

| Inner Layer Component | Parts by weight |
|---|---|
| Polymer A | 84.5 |
| IR Dye A | 15 |
| Byk ® 307 | 0.5 |

This inner layer formulation solution was coated on Substrate A and dried at 135° C. for 45 seconds to provide a dry coating weight of 1.3 g/m$^2$.

An upper layer formulation was prepared with Copolymer 2 (2.4 g), Byk® 307 (0.012 g) and Ethyl Violet (0.013 g) that were dissolved in 20 g of a solvent mixture of DEK and Dowanol PM (9:1 weight ratio) and coated over the dried inner layer to provide a dry outer layer coating weight of 0.65 g/m$^2$.

The thermally imageable element thus formed was dried at 135° C. for 45 seconds. The element was imaged with test patterns at 9W and drum speeds between 150 rpm and 360 rpm in steps of 30 rpm using a Creo Quantum 800 imagesetter (67–161 mJ/cm$^2$). The resulting imaged printing plate was developed with 989 Developer for 30 seconds to give a good image with excellent resolution and clean background at exposures greater than 93 mJ/cm$^2$.

The solubility of Copolymer 1 in 989 Developer was evaluated by stirring 0.3 g of Copolymer 1 in 30 ml of the developer. Copolymer 2 dissolved completely without leaving any residue.

Example 2

A positive-working imageable of this invention was prepared as follows. An inner layer formulation (6% solids) was prepared by dissolving the following components shown in TABLE II in a solvent mixture comprising MEK (45%), PMA (35%), BLO (10%), and water (10%).

TABLE II

| Inner Layer Component | Parts by weight |
|---|---|
| Polymer B | 84.5 |
| IR Dye A | 15 |
| Byk ® 307 | 0.5 |

This inner layer formulation solution was coated on Substrate A and dried at 135° C. for 45 seconds to provide a dry coating weight of 1.35 g/m$^2$.

An upper layer formulation was prepared with Copolymer 1 (2.4 g), Byk® 307 (0.012 g) and Ethyl Violet (0.013 g) that were dissolved in 20 g of a solvent mixture of DEK, Dowanol PM, and isopropyl alcohol (8:1:1 weight ratio) and coated over the dried inner layer to provide a dry outer layer coating weight of 0.55 g/m$^2$.

The thermally imageable element thus formed was dried at 135° C. for 45 seconds. The element was imaged with test patterns at 9W and drum speeds between 150 rpm and 360 rpm in steps of 30 rpm using a Creo Quantum 800 imagesetter (67–161 mJ/cm$^2$). The resulting imaged printing plate was developed with 980 Developer in a Glunz and Jensen processor at 1200 mm/min to give a good image with excellent resolution and clean background at exposures greater than 93 mJ/cm$^2$.

The solubility of Copolymer 1 in 980 Developer was evaluated by stirring 0.3 g of Copolymer 1 in 30 ml of the developer. Copolymer 1 dissolved completely without leaving any residue.

Example 3

A positive-working imageable of this invention was prepared as follows. An inner layer formulation (6% solids) was prepared by dissolving the following components shown in TABLE III in a solvent mixture comprising MEK (45%), PMA (35%), BLO (10%), and water (10%).

TABLE III

| Inner Layer Component | Parts by weight |
|---|---|
| Polymer A | 59.5 |
| Polymer C | 15.0 |
| GP resole | 10.0 |
| IR Dye A | 15 |
| Byk ® 307 | 0.5 |

This inner layer formulation solution was coated on Substrate A and dried at 135° C. for 45 seconds to provide a dry coating weight of 1.35 g/m$^2$.

An upper layer formulation was prepared with Copolymer 2 (2.4 g), Byk® 307 (0.012 g) and Ethyl Violet (0.013 g) that were dissolved in 20 g of a solvent mixture of DEK, Dowanol PM, and isopropyl alcohol (8:1:1 weight ratio) and coated over the dried inner layer to provide a dry outer layer coating weight of 0.60 g/m$^2$.

The thermally imageable element thus formed was dried at 135° C. for 45 seconds. The element was imaged with test patterns at 9W and drum speeds between 150 rpm and 360 rpm in steps of 30 rpm using a Creo Quantum 800 imagesetter (67–161 mJ/cm$^2$). The resulting imaged printing plate was developed with W129 C3A Developer for 30 seconds to give a good image with excellent resolution and clean background at exposures greater than 93 mJ/cm$^2$.

The solubility of Copolymer 2 in W129 C3A Developer was evaluated by stirring 0.3 g of Copolymer 2 in 30 ml of the developer. Copolymer 2 dissolved completely without leaving any residue.

Example 4

A positive-working imageable of this invention was prepared as follows. An inner layer formulation (6% solids) was prepared by dissolving the following components shown in TABLE IV in a solvent mixture comprising MEK (45%), PMA (35%), BLO (10%), and water (10%).

TABLE IV

| Inner Layer Component | Parts by weight |
|---|---|
| Polymer B | 84.5 |
| IR Dye A | 15 |
| Byk ® 307 | 0.5 |

This inner layer formulation solution was coated on Substrate A and dried at 135° C. for 45 seconds to provide a dry coating weight of 1.35 g/m$^2$.

An upper layer formulation was prepared with Copolymer 3 (2.4 g), Byk® 307 (0.012 g) and Ethyl Violet (0.013 g) that were dissolved in 20 g of a solvent mixture of DEK, Dowanol PM, and isopropyl alcohol (8:1:1 weight ratio) and coated over the dried inner layer to provide a dry outer layer coating weight of 0.55 g/m$^2$.

The thermally imageable element thus formed was dried at 135° C. for 45 seconds. The element was imaged with test patterns at 9W and drum speeds between 150 rpm and 360 rpm in steps of 30 rpm using a Creo Quantum 800 imagesetter (67–161 mJ/cm$^2$). The resulting imaged printing plate was developed with 956 Developer for 30 seconds to give a good image with excellent resolution and clean background at exposures greater than 89 mJ/cm$^2$.

The solubility of Copolymer 3 in 956 Developer was evaluated by stirring 0.3 g of Copolymer 3 in 30 ml of the developer. Copolymer 3 dissolved almost completely with very little residue. In comparison, the same size sample of poly(methyl methacrylate) did not dissolve in the developer.

Example 5

Inner and outer layer formulations were prepared using the components shown below in TABLE V (each 100 g of solution with 7% solids).

TABLE V

| Inner Layer | | | | | |
|---|---|---|---|---|---|
| JK58 | ACR1755 | IR Dye B | IR Dye C | Byk ® 307 (10% solution in DEK) | Solvent* |
| 3.594 | 2.100 | 0.700 | 0.560 | 0.455 | 92.591 |

| Outer Layer | | | |
|---|---|---|---|
| Copolymer 1 | Ethyl violet (1% solution in acetone) | Byk ® 307 (10% solution in DEK) | Solvent** |
| 6.930 | 1.400 | 0.560 | 91.110 |

*Solvent = MEK/PGME/BLO/Water (50/30/10/10 by weight)
**Solvent = DEK/PGMEA (92/8 by weight)

The inner layer formulation was applied to Substrate A using a 0.012 inch (0.03 cm) wire-wound bar and dried for 30 seconds at 135° C. to provide a dry coating of about 1.5 $g/m^2$.

The outer layer formulation was applied over the dried inner layer using a 0.006 inch (0.015 cm) wire-wound bar and dried for 30 seconds at 135° C. to provide a dry coating of about 0.60 $g/m^2$.

The resulting imageable elements of this invention were subjected to the following tests:

Developer solubility: Drops of water:ND1 (4:1 weight ratio) were applied to the unexposed element at 10-second intervals for up to 120 seconds. The developer solution was washed off immediately with water. The time required for the developer solution to begin attacking the outer layer was recorded.

Imaging tests: The elements were imaged using a Screen PTR4300 platesetter using the C1 2400 Dpi internal test pattern at a drum speed of 1000 rpm with exposures of 50, 55, 60, 65, 70, 75, 80, 85 and 90% power. The imaged elements were then processed in a Kodak Polychrome Graphics PK910II processor containing water/ND1 (4.5:1 weight ratio). The processor was equipped with two plush rollers in the processing tank and the developer temperature was 30° C. and the development time was 12 seconds. The resulting processed printing plates were evaluated for cleanout (minimum exposure necessary to produce a clean image) and best exposure (the exposure which produces best image quality).

The results of the tests are shown below in TABLE VI. The unexposed elements exhibited good resistance to the developer solution and the exposed outer layer of the printing plates was easily removed by the developer solution in the processor. The printing plates provided an excellent, high contrast, and high-resolution image.

TABLE VI

| Developer Drop Test | Clean Out Energy | Best Exposure | Comments |
|---|---|---|---|
| 60 seconds | 75% power | 85% power | Image had excellent resolution |

A further evaluation of Copolymer 1 was carried out as follows. The ND1 developer was diluted with 4 parts water to make ND1 (1+4) developer solution. Copolymer 1 (0.1 g) was added to 9.9 g of the ND1 (1+4) developer solution and mixed for 24 hours, after which the developer solution was inspected for insoluble residues. The developer solution was found to be completely clear of insoluble material. Copolymer 1 had completely dissolved.

The results from the evaluations in this Example demonstrate that although the outer layer Copolymer 1 provided sufficient resistance to the developer solution to form an excellent image in the exposed and developed printing plate, it ultimately was fully dissolved in the developer solution.

Copolymer 1 is regarded as a clean processing polymeric binder for the outer layer. Filtration of the developer solution is not required when it is used according to the present invention and solid deposits of coating residues in the processing tank are not likely over time. Thus, Copolymer 1 and other second polymeric binders within the scope of this invention are ideal for use in imageable elements that are processed using negative type developers in dip-tank processors with little filtration required to maintain the developer solutions.

The invention has been described in detail with particular reference to certain preferred embodiments thereof, but it will be understood that variations and modifications can be effected within the spirit and scope of the invention.

The invention claimed is:

1. A positive-working imageable element that is developable with an alkaline developer after thermal imaging, and that comprises an infrared radiation absorbing compound and a substrate having thereon, in order:

an inner layer comprising a first polymeric binder, and an ink receptive outer layer comprising a second polymeric binder different than said first polymeric binder, said second polymeric binder comprising recurring units represented by the following Structure (I) or (II), which recurring units comprise at least 3 mol % of the total recurring units in said second polymeric binder:

(I)

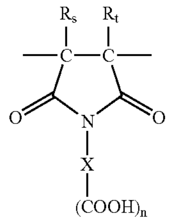

(II)

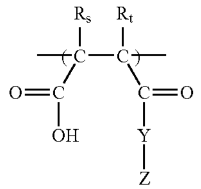

wherein n is 1 to 3, $R_s$ and $R_t$ are independently hydrogen or an alkyl or halo group, X is a multivalent linking group, Y is oxy or —NR— wherein R is hydrogen or an alkyl or aryl group, and Z is a monovalent organic group.

2. The element of claim 1 wherein n is 1 or 2, $R_s$ and $R_t$ are independently hydrogen or a methyl group, X is a multivalent aliphatic or arylene group or a combination thereof, R is an alkyl group, and Z is an monovalent aliphatic or aromatic group, or a combination thereof.

3. The element of claim 1 wherein $R_s$ and $R_t$ are independently hydrogen or a methyl group, X is a phenylene group, n is 1, Y is oxy, and Z is a —R'—NHC(=O)R" group wherein R'is an alkylene group and R" is an alkyl or aryl group, or Z is an alkyl group.

4. The element of claim 1 wherein $R_s$ and $R_t$ are independently hydrogen or a methyl group, Y is oxy and Z is a —$CH_2CH_2NHC(=O)$-phenyl group or an alkyl group having 1 to 8 carbon atoms.

5. The element of claim 1 wherein said second polymeric binder has an acid number of at least 20 mg KOH/g.

6. The element of claim 1 wherein said second polymeric binder is present in said outer layer at a dry coverage of from about 1 to 100 weight % based on total dry weight of said outer layer.

7. The element of claim 1 wherein said second polymeric binder is represented by the following Structure (III):

$$-(A)_x-(B)_y \quad \text{(III)}$$

wherein A represents recurring units defined by either Structure (I) or (II) or both Structure (I) and (II), B represents recurring units different than both of Structure (I) and (II), x is about 3 to about 15 mol %, and y is from about 85 to about 97 mol %.

8. The element of claim 7 wherein B represents recurring units derived from one or more (meth)acrylates, (meth) acrylamides, vinyl ethers, vinyl esters, vinyl ketones, olefins, unsaturated imides, unsaturated anhydrides, N-vinyl pyrrolidone, N-vinyl carbazole, 4-vinyl pyridine, (meth) acrylonitriles, styrenic monomers, or combinations thereof.

9. The element of claim 7 wherein B represents recurring units derived from one or more (meth)acrylates, (meth) acrylonitriles, N-phenylmaleimide, monomers having pendant cyclic urea groups, or (meth)acrylamides.

10. The element of claim 7 wherein x is from about 5 to 10 mol % and y is from about 90 to about 95 mol %.

11. The element of claim 1 wherein said infrared radiation absorbing compound is a carbon black or IR absorbing dye having a maximum absorption at from about 700 to about 1200 nm and is present in said inner layer in an amount of at least 5 weight %.

12. The element of claim 1 wherein said first polymeric binder is a (meth)acrylic resin comprising carboxy groups, a maleated wood rosin, a styrene-maleic anhydride copolymer, a (meth)acrylamide polymer, a (meth)acrylonitrile polymer, a polymer derived from an N-substituted cyclic imide, a polymer having pendant cyclic urea groups, and polymers derived from an N-alkoxyalkyl-methacrylamide.

13. The element of claim 1 wherein said first polymeric binder is a copolymer derived from one or more of an N-substituted cyclic imide, a (meth)acrylonitrile, (meth) acrylic acid, and a monomer having a pendant cyclic urea group.

14. The element of claim 1 wherein said inner layer has a dry coating coverage of from about 0.5 to about 2.5 $g/m^2$ and said outer layer has a dry coating coverage of from about 0.2 to about 1 $g/m^2$.

15. A method for forming an image comprising:

A) thermally imaging a positive-working imageable element that is developable in an alkaline developer before thermal exposure, and comprises an infrared radiation absorbing compound and a substrate having thereon, in order:

an inner layer comprising a first polymeric binder, and an ink receptive outer layer comprising a second polymeric binder different than said first polymeric binder, said second polymeric binder comprising recurring units represented by the following Structure (I) or (II), which recurring units comprise at least 3 mol % of the total recurring units in said second polymeric binder:

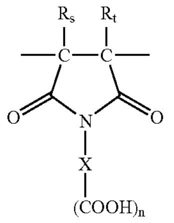

(I)

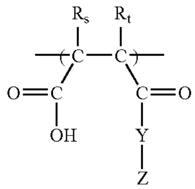

(II)

wherein n is 1 to 3, $R_s$ and $R_t$ are independently hydrogen or an alkyl or halo group, X is a divalent linking group, Y is oxy or —NR— wherein R is hydrogen or an alkyl group, and Z is a monovalent organic group, thereby forming an imaged element with imaged and non-imaged regions, B) contacting said imaged element with an alkaline developer to remove only said imaged regions, and C) optionally, baking said imaged and developed element.

16. The method of claim 15 wherein imaging in step A is carried out using infrared radiation in the range of from about 700 nm to about 1200 nm.

17. The method of claim 15 wherein said second polymeric binder having is represented by the following Structure (III):

$$-(A)_x-(B)_y- \quad \text{(III)}$$

wherein A represents recurring units defined by either Structure (I) or (II) or both of Structures (I) and (II), B represents recurring units different than both of Structures (I) and (II), x is about 3 to about 15 mol %, and y is from about 85 to about 97 mol %.

18. The method of claim 17 wherein B represents recurring units derived from one or more (meth)acrylates, (meth) acrylamides, vinyl ethers, vinyl esters, vinyl ketones, olefins, unsaturated imides, unsaturated anhydrides, N-vinyl pyrrolidone, N-vinyl carbazole, 4-vinyl pyridine, (meth) acrylonitrile, styrenic monomers, or combinations thereof, x is from about 5 to 10 mol %, y is from about 90 to about 95 mol % (preferred range), and said infrared radiation absorbing compound is a carbon black or IR absorbing dye and is present in said inner layer in an amount of from about 5 to about 30 weight %.

19. The method of claim 15 wherein said alkaline developer is a solvent-based negative alkaline developer.

20. An imaged element obtained from the method of claim 15.

* * * * *